(12) United States Patent
Mochizuki et al.

(10) Patent No.: US 8,177,990 B2
(45) Date of Patent: May 15, 2012

(54) ETCHING METHOD, PLASMA PROCESSING SYSTEM AND STORAGE MEDIUM

(75) Inventors: Ryou Mochizuki, Nirasaki (JP); Jun Yashiro, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 1314 days.

(21) Appl. No.: 11/730,197

(22) Filed: Mar. 29, 2007

(65) Prior Publication Data

US 2007/0284337 A1 Dec. 13, 2007

Related U.S. Application Data

(60) Provisional application No. 60/794,842, filed on Apr. 26, 2006.

(30) Foreign Application Priority Data

Mar. 31, 2006 (JP) .................................. 2006-099685

(51) Int. Cl.
 *H01L 21/302* (2006.01)
(52) U.S. Cl. ............... 216/46; 216/67; 216/80; 438/636; 438/723; 438/743; 438/947
(58) Field of Classification Search ........................ None
 See application file for complete search history.

(56) References Cited

U.S. PATENT DOCUMENTS

| | | | | |
|---|---|---|---|---|
| 6,613,484 | B2 * | 9/2003 | Dalton et al. | 430/5 |
| 6,696,366 | B1 * | 2/2004 | Morey et al. | 438/712 |
| 6,835,663 | B2 * | 12/2004 | Lipinski | 438/695 |
| 7,018,780 | B2 * | 3/2006 | Vahedi et al. | 430/314 |
| 7,241,683 | B2 * | 7/2007 | Hudson et al. | 438/637 |
| 7,682,516 | B2 * | 3/2010 | Sadjadi et al. | 216/41 |
| 7,767,926 | B2 * | 8/2010 | Balasubramaniam | 219/121.43 |
| 2004/0217086 | A1 | 11/2004 | Kawashima | |
| 2006/0154477 | A1 * | 7/2006 | Geng et al. | 438/637 |
| 2006/0205220 | A1 * | 9/2006 | Hudson et al. | 438/694 |

FOREIGN PATENT DOCUMENTS

| | | |
|---|---|---|
| JP | 64-25419 | 1/1989 |
| JP | 10-268526 | 10/1998 |
| JP | 2001-68462 | 3/2001 |
| JP | 2004-103925 | 4/2004 |

OTHER PUBLICATIONS

Ohiwa Tokuhisa, "Reactive Ion Etching", Toshiba Review, vol. 59, No. 8, pp. 22-25 (2004).
Japanese Office Action issued on Nov. 1, 2011 for Application No. 2006-099685 with English translation.

* cited by examiner

*Primary Examiner* — Anita Alanko
(74) *Attorney, Agent, or Firm* — Smith, Gambrell & Russell, LLP

(57) ABSTRACT

Disclosed is a method of etching a substrate having a layered structure in which a photoresist mask with a pattern, a coating film made of silicon oxide, and an organic film are laminated in that order from the top. Before etching the coating film of silicon oxide, a deposit is deposited on the photoresist mask by using plasma generated from a hydrocarbon gas such as $CH_4$ gas so as to narrow the size of openings in the pattern of the photoresist mask. The pattern of the photoresist mask is well transferred to the organic film through the coating film, and a pattern with openings having a high aspect ratio can be formed in the organic film and toppling of the pattern in the organic film can be prevented. The organic film with the transferred pattern is used as an etch mask for etching the underlying layer.

12 Claims, 7 Drawing Sheets

EXAMPLE 3
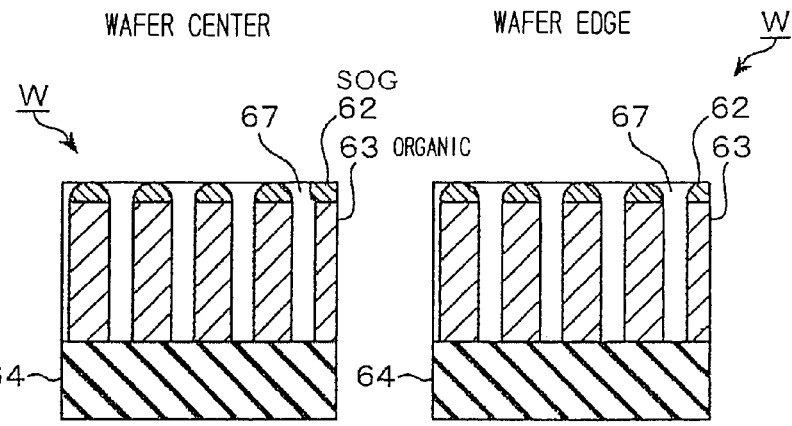
| SOG FILM THICKNESS | 40nm | 40nm |
|---|---|---|
| OPENING BOTTOM DIMENSION | 40nm | 40nm |
COMPARATIVE EXAMPLE 3
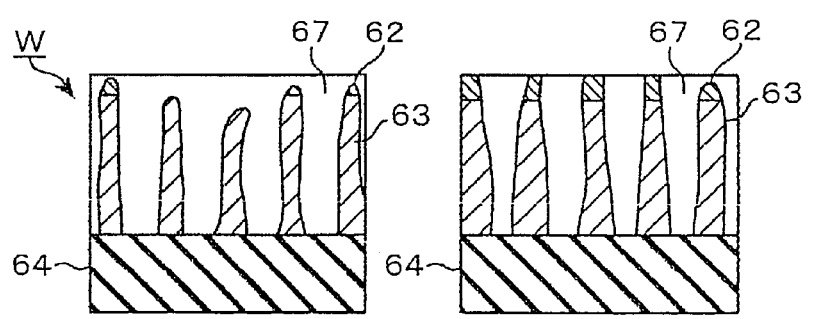
| SOG FILM THICKNESS | 0～5nm | 5nm |
|---|---|---|
| OPENING BOTTM DIMENSION | 65nm | 55nm |
F I G . 4

-- Prior Art --

(a)

(b)

US 8,177,990 B2

ETCHING METHOD, PLASMA PROCESSING SYSTEM AND STORAGE MEDIUM

CROSS-REFERENCE TO RELATED APPLICATION

This application claims the benefit of U.S. provisional application No. 60/794,842 filed on Apr. 26, 2006, the entire disclosure of which is incorporated herein by reference.

TECHNICAL FIELD

The present invention relates to a technique for etching a substrate such as a semiconductor wafer having a layered structure in which a mask made of an organic material, a coating film made of silicon oxide, and an organic film are laminated in that order from the top.

BACKGROUND ART

With the tendency of higher integration of semiconductor devices every year, resist materials and exposure techniques have been improved in response to miniturization of patterns formed on a substrate such as a semiconductor wafer (hereinafter referred to as a "wafer"), and the dimension of an opening formed in a resist mask has also been reduced.

However, as a pattern formed in a resist mask is miniaturized, the aspect ratio (which is a ratio of the depth of the opening to the width of the opening) of the opening formed in the resist mask is larger. This causes toppling of the resist mask. Thus, a multilayer resist film having high strength is used when a pattern of a high aspect ratio is necessary (See Japanese patent laid-open publication JP10-268526A, Paragraph 0002-0006; and Toshiba Review, Vol. 59 No. 8 Page 22 (2004), for example).

As shown in FIG. 6(a), a wafer 100, which is a substrate used in such a process, has a structure in which: a photoresist mask 70 having openings 75 formed therein; an SOG (Spin On Glass) film 71 formed of a coating film made of $SiO_2$; an organic film 72 formed of an organic matter having higher strength than the photoresist mask 70; and an insulating film made of an inorganic matter such as a silicon oxide film 73 are stacked in that order on an Si layer 74 having a gate electrode (not shown) formed therein. In the wafer 100, as shown in FIG. 6(b), the SOG film 71 is etched, for example, by using plasma of $CF_4$ gas. Then, the organic film 72 is etched and the photoresist mask 70 is removed with the use of plasma of an 02 gas, as shown in FIG. 6(c). After that, the silicon oxide film 73 is etched, the SOG film 71 is removed, and holes 76 are formed as shown in FIG. 6(c). With this layered structure, a resist mask (the organic film 72) having a pattern with a high aspect ratio can be formed on the silicon oxide film 73, i.e., an etch target film, while the possibility of toppling is reduced, whereby a fine pattern can be transferred to the silicon oxide film 73. In this process, each of the photoresist mask (film) 70, the SOG film 71, and the organic film 72 is used as an etch mask for etching an underlying film, and therefore, each of the films is made of a material different from that of an underlying film to be etched (with a high etch selectivity).

In recent years, as shown in FIG. 7(a), openings 75 in a pattern have an elliptical shape, and side wall portions of the openings 75 with a small thickness laterally extend between the openings 75, and the height of the side wall portions are large. Thus, the side wall portions are likely to be toppled. In order to reduce the size of the openings 75 formed in the photoresist mask 70, the present inventors have been studying to deposit a material on the side walls of the opening 75. To this end, it is considered that a C—H—F series gas, which is per se widely used, may be used so as to produce a deposit and reduce the size of the openings. In this case, however, the following problem occurs. That is, when a C—H—F series deposit is deposited on the photoresist mask 70 in order to reduce the dimension of the opening, the deposit also adheres to the inner wall of a processing chamber. Then, the SOG film 71 is etched, and the organic film 72 is subsequently etched by using the SOG film 71 as a mask. When the organic film 72 is etched, the deposit, which has adhered to the inner wall of the processing chamber, is etched by active species of oxygen so as to be released into the atmosphere. As the deposit includes fluorine, the SOG film 71 is etched and thus no longer function as a mask, as shown in FIGS. 7(a) and 7(b). To be more specific, the openings 75 formed in the SOG film 71 are etched so that the shape of the openings 75 is deteriorated, and the shape of the openings thus deteriorated is transferred to holes 76 formed in the silicon oxide film 73 through the organic film 72. As a result, the shape of the holes 76 is deteriorated such that vertical steaks called striations are developed in the holes 76. Thus, it is necessary that the inner walls of the processing chamber be cleaned between the etching of the SOG film 71 and the etching of the organic film 72. Therefore, the wafer 100 is required to be taken out of the processing chamber. This prevents the processes from being continuously performed in the same processing chamber.

JP2004-103925A (paragraph 0017 and 0055) discloses the use of $CF_4$ gas, $CHF_3$ gas, $CH_2F_2$ gas, or $CH_4$ gas for depositing a material on a resist mask, however, fails to suggest the way of solving the foregoing problem.

SUMMARY OF THE INVENTION

The present invention has been made under such circumstances. The object of the present invention is to provide a technique for etching a substrate having a layered structure, in which a mask made of an organic material and having a pattern formed therein, a coating film made of silicon oxide, and an organic film are laminated in that order from top, so as to transfer the pattern of the mask to the organic film to form a pattern with a high aspect ratio in the organic film and having little possibility of toppling. Another object of the present invention is to provide a technique for continuously processing a substrate having the aforementioned structure in the same processing chamber.

According to an aspect of the present invention, there is provided a method of etching a substrate having a layered structure in which a mask made of an organic material and having a pattern formed therein, a coating film made of silicon oxide, and an organic film are laminated in that order from top. The method includes the steps of: converting, into plasma, a process gas containing a hydrocarbon gas in a processing chamber, and producing a deposit covering the pattern of the mask by using the plasma; and thereafter etching the coating film in the processing chamber by using a plasma, by using the mask covered by the deposit as an etch mask.

The method may further include a step of etching the organic film by using the coating film as an etch mask, after etching the coating film.

The process gas may include, in addition to the hydrocarbon gas, a diluent gas not containing halogen. The hydrocarbon gas may be $CH_4$ gas.

According to another aspect of the present invention, there is provided a plasma processing system that performs an etching process to a substrate having a layered structure in which a mask made of an organic material and having a pattern formed therein, a coating film made of silicon oxide, and an organic film are laminated in that order from top. The system includes: a processing chamber having therein a table for placing the substrate thereon; means for supplying a process gas containing a hydrocarbon gas into the processing chamber; means for supplying a gas for etching the coating film into the processing chamber; means for evacuating an interior of the processing chamber; means for converting a gas in the processing chamber into plasma; and a control unit for, after the substrate is placed on the table, controlling each of the means such that the process gas containing the hydrocarbon gas is converted into plasma to produce a deposit covering the pattern of the mask by using the plasma thus converted, and thereafter the gas for etching the coating film is converted into plasma.

The plasma processing system may further include means for supplying a gas used for etching the organic film into the processing chamber, wherein the control unit may be also configured so that, after the coating film is etched, the control unit controls each of the means such that a gas for etching the organic film is converted into plasma.

According to still another aspect of the present invention, a storage medium stores a computer program that is used for the plasma processing system and that operates on a computer, wherein the computer program includes a step of performing the foregoing etching method.

According to the present invention, due to the deposition of the deposit on the photoresist film, a pattern with a high aspect ratio can be formed in the organic film while the possibility of toppling is reduced. In addition, even when the deposited material is decomposed by the subsequent plasma etching process, any plasma that functions as an etchant for the coating film is not produced. Thus, the reduction of the thickness of the coating film is minimized and widening and deformation of concave portions formed in the coating film is suppressed. Therefore, the substrate can be continuously processed in the same processing chamber.

BRIEF DESCRIPTION OF DRAWINGS

FIG. 4 shows illustrations showing results of Experiment 3;

BEST MODE FOR CARRYING OUT THE INVENTION

Figure 1:
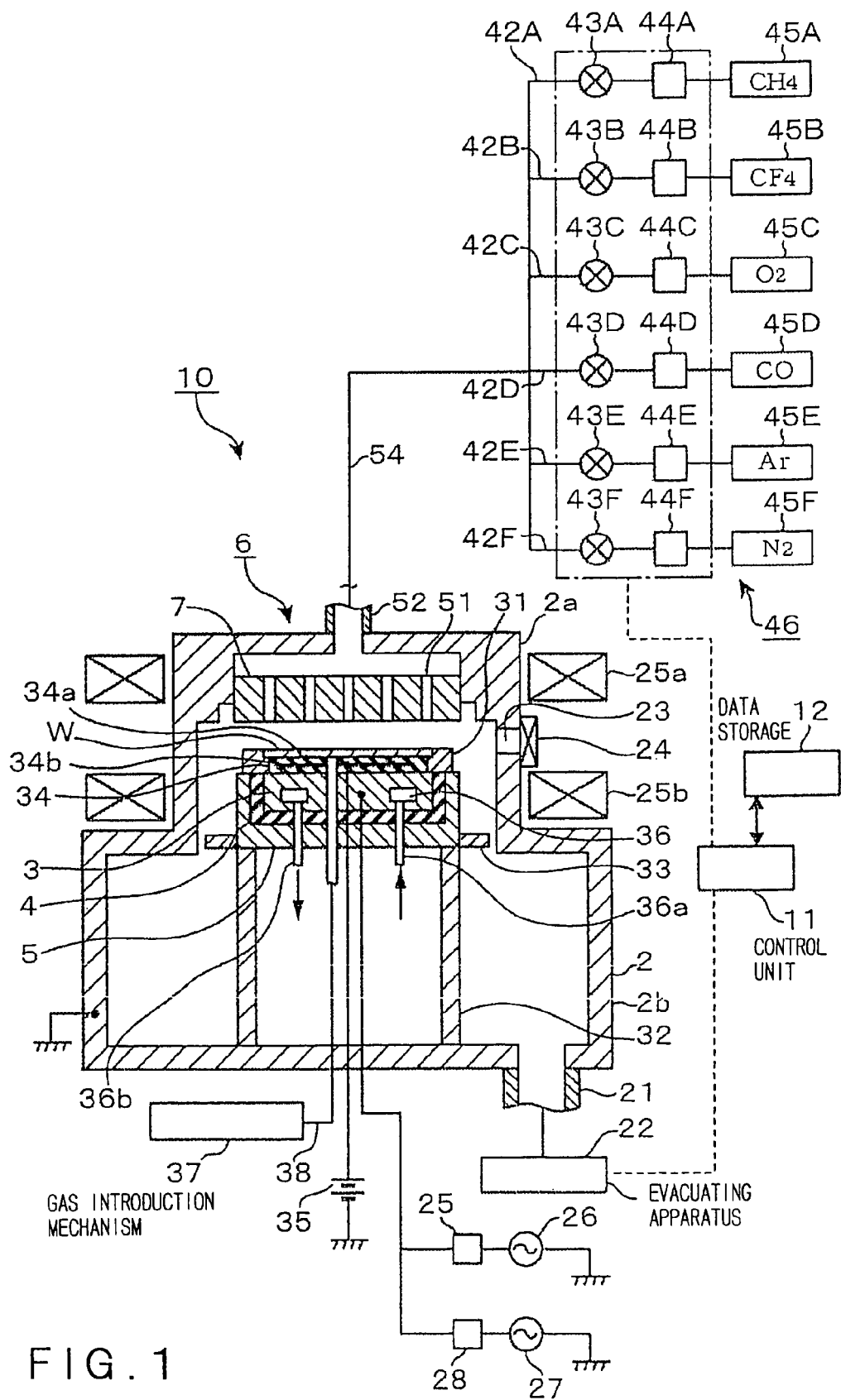
FIG. 1 is a vertical cross-sectional view showing a plasma processing system in one embodiment of the present invention.

A description will be made of an example of the plasma processing system adapted to perform the etching method according to the present invention with reference to FIG. 1. FIG. 1 shows a RIE (reactive ion etching) plasma processing system 10. The RIE plasma processing system 10 has a processing chamber 2. The processing chamber 2 is a vacuum chamber made of, for example, aluminum. The processing chamber 2 is made up of an upper cylindrical compartment 2a of a smaller diameter and a lower cylindrical compartment 2b of a larger diameter, and is airtight. Provided in the upper compartment 2a is a support table 3, which functions as a table for horizontally holding a semiconductor wafer W (i.e., a substrate to be processed), and also functions as a lower electrode. The support table 3 is made of, for example, aluminum and is supported by a conductive support stage 5 through an insulating plate 4. A focus ring 31 made of, for example, silicon is provided on the upper circumference of the support table 3 so as to surround the wafer W. The focus ring 31 focuses plasma onto the wafer W placed on the support table 3 when the plasma is produced. The lower portion of the support stage 5 is covered with a cover 32. A baffle plate 33 is provided outside the support stage 5 and electrically conducted to the processing chamber 2 through the support stage 5 and the cover 32. The processing chamber 2 is electrically grounded.

Provided at a ceiling wall portion of the processing chamber 2 is a shower head 6, which is a gas supply part for introducing a process gas into the processing chamber 2. A gas supply port 52 is provided at the upper portion of the shower head 6, extends through the center of the upper wall of the processing chamber 2, and is connected to a gas supply pipe 54 which will be described later. An upper electrode 7 is provided with a plurality of gas discharge ports 51 formed in the lower surface of the shower head 6. The upper electrode 7 is formed so as to face the support table 3. That is, the upper electrode 7 and the support table 3 which functions as the lower electrode serves as parallel-plate electrodes which are means for converting a gas existing in the processing chamber 2 into plasma. The upper electrode 7 is electrically grounded through the processing chamber 2.

An exhaust pipe 21 is connected to the bottom wall of the lower compartment 2b and is connected to an evacuating apparatus 22 i.e., evacuating means. The evacuating apparatus 22 can evacuates the interior of the processing chamber 2 to a predetermined degree of vacuum. A wafer transfer port 23, through which the wafer W is transferred into and out of the processing chamber 21, is formed in the side wall of the upper compartment 2a. The transfer port 23 may be opened and closed by a gate valve 24.

The support table 3 is connected to a first high frequency power source 26 and a second high frequency power source 27 through matching boxes 25 and 28, respectively. The first high frequency power source 26 is used for generating plasma, and the second high frequency power source 27 is used for ion drawing. The first high frequency power source 26 and the second high frequency power source 27 each supply the support table 3 with predetermined high frequency power. The second high frequency power supply 27 supplies a power of a frequency lower than that of the first high frequency power supply 26.

An electrostatic chuck 34 is provided on the surface of the support table 3 so as to electrostatically hold the wafer W. The electrostatic chuck 34 is configured such that an electrode 34a buried therein is covered with an insulating material 34b. The electrode 34a is connected to a direct current (dc) power source 35.

A cooling chamber 36 is provided in the support table 3. The cooling chamber 36 is connected to a cooling medium feed pipe 36a and a cooling medium discharge pipe 36b. A cooling medium circulates through the cooling chamber 36 via the cooling medium feed pipe 36a and the cooling medium discharge pipe 36*b* so as to adjust the temperature of the wafer W via the support table 3.

A gas introduction mechanism 37 is provided to feed a cooling gas into a gap between the surface of the electrostatic chuck 34 and the back surface of the wafer W through a gas supply line 38. Thus, the gas introduction mechanism 37 can adjust the temperature of the wafer W.

The gas supply pipe 54 is branched into six branch pipes 42A to 42F on the upstream side thereof. The branch pipes 42A to 42F are connected to gas supply sources 45A to 45F through valves 43A to 43F and gas flow rate control units 44A to 44F, respectively. The valves 43A to 43F and the gas flow rate control units 44A to 44F form a gas supply system 46. The gas supply system 46 controls the flow rate and the supplying or the stopping supplying of a gas fed from each of the gas supply sources 45A to 45F according to control signals sent from a control unit 11. The control unit 11 will be described later. The branch pipe 42A, the valve 43A, the gas flow rate control unit 44A and the gas supply source 45A constitute means for supplying a process gas used for producing a deposit. The branch pipe 42B, the valve 43B, the gas flow rate control unit 44B and the gas supply source 45B constitute means for supplying a gas used for etch a silicon oxide film, a coating film and the like. The branch pipe 42C, the branch pipe 42D, the valve 43C, the valve 43D, the gas flow rate control unit 44C, the gas flow rate control unit 44D, the gas supply source 45C, and the gas supply source 45D constitute means for supplying a gas used for etching an organic matter such as an organic film 63 which will be described later.

Two multipole ring magnets 25*a* and 25*b* are disposed around the upper compartment 2*a* above and below the transfer port 23, respectively. The multipole ring magnets 25*a* and 25*b* are disposed so that a plurality of anisotropic segment columnar magnets are attached to a ring-shaped magnetic casing and magnetic orientations of adjacent anisotropic segment columnar magnets are opposite to each other. With this arrangement, magnetic field lines are generated between the adjacent anisotropic segment columnar magnets, whereby a magnetic field is generated at the periphery of the processing space between the upper and lower electrodes. Therefore, plasma can be confined in the processing space.

The plasma processing system 10 is provided with the control unit 11, which may be a computer for example. The control unit 11 is provided with a data processing part composed of component parts included in a conventional computer, such as a data storage medium (e.g., a hard disk drive, a memory device or the like), a CPU and so on. The data storage medium stores a process recipe and programs including a control programs. The process recipe specifies values of process parameters defining process conditions such as a process pressure, a process time, gas flow rates, electric powers and so on. The control program is configured so that, upon execution of the control program, the computer reads out the values of process parameter, and based on which the computer generates control signals and send them to respective functional component parts of the processing system to achieve the process conditions specified by the process recipe, so that process steps described below are performed. The programs (including a program relating to a display for inputting process parameters) may be stored in a removable storage medium such as a flexible disk, a compact disc, a magnetooptical disc, and may be installed in the computer, or the control unit 11, via such a removable storage medium.

Next, a description will be made of an embodiment of an etching method according to the present invention, the etching method being performed using the plasma processing system 10. First, the gate valve 24 is opened to transfer a 300 mm (12 inch) wafer W into the processing chamber 2 using a tranfer mechanism (not shown). The wafer is horizontally placed on the support table 3. After this, the wafer W is electrostatically held by the support table 3. Then, the transfer mechanism is withdrawn from the processing chamber 2, and the gate valve 24 is closed. Subsequently, a backside gas is supplied through the cooling medium feed pipe 36*a* so as to adjust the temperature of the wafer W to a predetermined temperature. After that, the following steps are performed.

Figure 2:
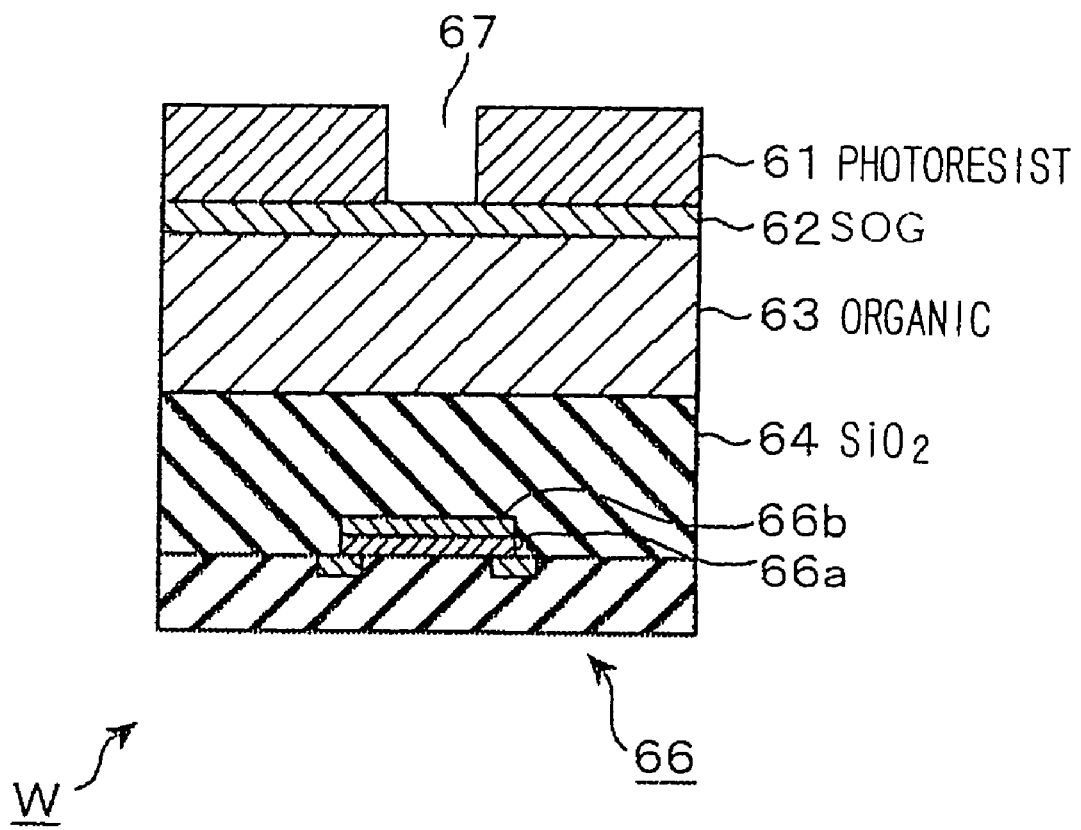
FIG. 2 is a view showing an example of the structure of a wafer used in the present invention.

FIG. 2 is a view showing a structure of the surface portion of the wafer W. Note that this embodiment relates to part of a process of forming a contact hole used for embedding an electrode in a layer disposed above a gate electrode. In FIG. 2, reference numeral 61 denotes a photoresist mask made of an organic material; 62, a SOG film which is a coating film; reference numeral 63 denotes an organic film made mainly of, for example, carbon; reference numeral 64 denotes a silicon oxide film formed of an $SiO_2$ film; and reference numeral 67 denotes an opening formed in the photoresist mask. A transistor portion 66 including a gate oxide film 66*a* and a gate electrode 66*b* is disposed below the silicon oxide film 64. Note that the transistor portion 66 is simplified or omitted in FIGS. 3 to 5.

Step 1: Deposition Process

Figure 3:
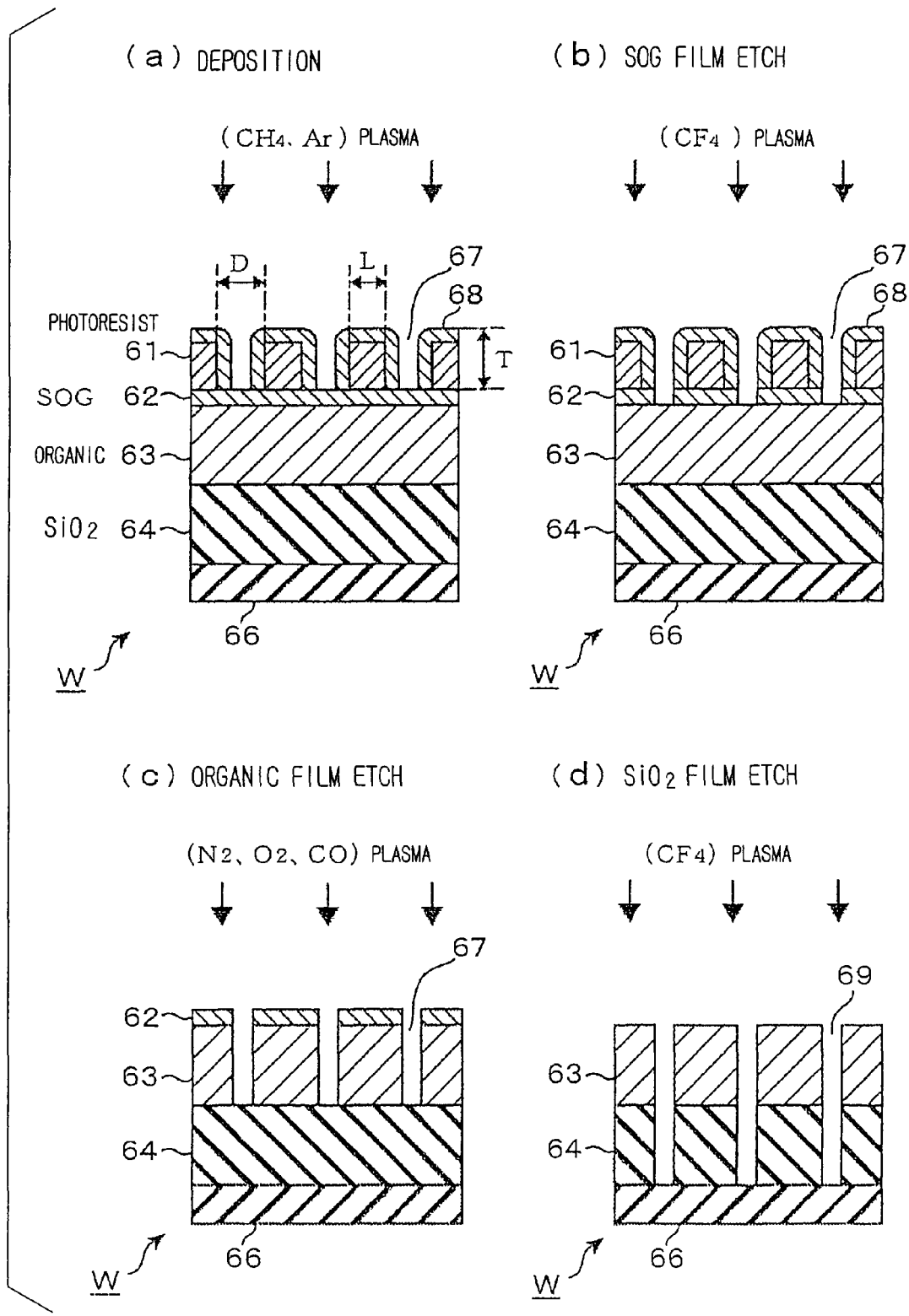
FIG. 3 shows illustrations showing schematic cross-sectional views of a wafer after subjected to respective process steps.

After the evacuating apparatus 22 operates to evacuate a gas existing in the processing chamber 2 through the exhaust pipe 21 and maintain a predetermined degree of vacuum in the processing chamber 2, the gas supply system 46 supplies, for example, $CH_4$ gas and Ar gas. Next, a first high frequency of, for example, 100 MHz and with power of 1000 W is supplied to the support table 3 so as to convert the mixed process gas including the abovementioned $CH_4$ gas and Ar gas into plasma. Also, the intensity of each of the magnetic fields generated by the muiltipole ring magnets 25*a* and 25*b* is set to, for example, 300 G. This state is maintained for a predetermined period of time, for example, 30 seconds, and resultantly, as shown in FIG. 3(*a*), a deposit 68 made up of carbon and hydrogen is deposited on exposed surfaces of the wafer W (i.e., the top surface of the photoresist mask 61 and the side wall surface of each opening 67). As a result, the apparent film thickness of the photoresist mask 61 is increased, and dimension (size) D of the openings 67 is reduced and thus dimension L of convex portions of the photoresist mask 61 is increased.

Since it is difficult for the plasma to go deep in the openings 67, the deposit 68 is deposited mainly on the upper portion of the side wall of the opening 67 and the amount of the deposit 68 is smaller according to the proximity to the bottoms of the openings 67, and thus the deposit 68 is hardly deposited on the SOG film 62 which is exposed at the bottoms of the openings 67. Thus, the SOG film 62 can be etched with almost no influence of the deposit 68 in a process of etching the SOG film 62 (described later). Note that the shape of the deposit 68 deposited on the side wall of the openings 67 is not accurately illustrated in FIG. 3.

At that time, bias power is not supplied from the second high frequency power source 27 to the support table 3, and thus ions existing in the plasma are not strongly drawn into the wafer W so that the removal of the shoulder portion (portion in the vicinity of a ridge line defined by the top surface of the photoresist mask 61 and the side wall surface of the opening 67) of each opening 67 by the plasma is suppressed, maintaining the shape of each opening 67.

Since the deposit 68 is deposited on the openings 67 formed in the photoresist mask 61 in the above manner, the apparent opening dimension of the photoresist mask 61 can be reduced.

Step 2: SOG Film (62) Etching Process

The high frequency power sources 26 and 27 stop the supply of electric power, and generation of plasma in the processing chamber 2 is stopped. After that, the gas supply system 46 stops supplying the gas. Then, the evacuating apparatus 22 operates to evacuate a gas existing in the processing chamber 2 through the exhaust pipe 21 and maintain the interior of the processing chamber 2 to a predetermined degree of vacuum. After that, the gas supply system 46 supplies, for example, $CH_4$ gas. Next, a first high frequency of, for example, 100 MHz and with power of 1200 W is supplied to the support table 3 so as to convert the gas into plasma. Then, a second high frequency of, for example, 3.2 MHz and with power of 200 W is supplied to the support table 3, and the intensity of each of the magnetic fields generated by the muiltipole ring magnets 25a and 25b is set to, for example, 300 G.

The abovementioned plasma contains active species of a compound containing carbon and fluorine. When the SOG film 62 is exposed to an atmosphere containing the active species, the active species are reacted with atoms contained in the SOG film 62 so as to form a compound. The SOG film 62 is etched by the reaction so that the openings 67 are extended downwardly into the SOG film 62, as shown in FIG. 3(*b*).

Step 3: Organic Film (63) Etching Process

The high frequency power supplies 26 and 27 stop the supply of electric power, and generation of plasma in the processing chamber 2 is stopped. After that, the gas supply system 46 stops supplying the gas. Then, the evacuating apparatus 22 operates to evacuate a gas remaining in the processing chamber 2 through the exhaust pipe 21 and maintain the interior of the processing chamber 2 to a predetermined degree of vacuum.

The gas supply system 46 supplies, for example, $N_2$ gas, $O_2$ gas, and CO gas. A first high frequency of, for example, 100 MHz and with power of 2400 W is supplied to the support table 3 so as to convert the above gas into plasma. A second high frequency of, for example, 3.2 MHz and with power of 200 W is supplied to the support table 3, and the intensity of each of the magnetic fields generated by the multipole ring magnets 25a and 25b is set to, for example, 300 G.

Using the above plasma, the organic film 63 is etched so that the openings 67 are extended downwardly into the organic film 63, as shown in FIG. 3(*c*). In this etching process, as the organic film 63 is removed by the plasma obtained by converting $O_2$ gas and CO gas into plasma as described above, the photoresist mask 61 and the deposit 68 previously deposited on the exposed surface of the wafer W in the deposition process are etched.

In Step 1 (Deposition process), components decomposed from the $CH_4$ gas are attached to an inner wall and the like of the processing chamber 2 in addition to the surface of the wafer W, and those attached components are decomposed by the active species of oxygen included in the plasma used in Step 3. However, as those attached components do not include F (fluorine) and thus F radical functioning as an etchant for the SOG film 62 is not produced, the SOG film is not adversely influenced.

Step 4: Silicon Oxide Film (64) Etching Process

The high frequency power supplies 26 and 27 stop the supply of electric power, and generation of plasma in the processing chamber 2 is stopped. After that, the gas supply system 46 stops supplying the gas. Then, the evacuating apparatus 22 operates to evacuate a gas remaining in the processing chamber 2 through the exhaust pipe 21 and maintain the interior of the processing chamber 2 to a predetermined degree of vacuum.

The gas supply system 46 supplies, for example, $CF_4$ gas. A first high frequency of, for example, 100 MHz and with power of 500 W is supplied to the support table 3 so as to convert the gas into plasma. A second high frequency of, for example 3.2 MHz and with power of 4500 W is supplied to the support table 3, and the intensity of each of the magnetic fields generated by the multipole ring magnets 25a and 25b is set to, for example, 300 G.

Using the above plasma, the silicon oxide film 64 is etched using the organic film 63 as a mask as shown in FIG. 3(*c*). Concave portions 69, i.e., contact holes are formed. In this etching process, since the $CF_4$ gas is used, the SOG film 62 formed on the organic film 63 is etched together with the silicon oxide film 64.

Next, the organic film 63 is removed, for example, by ashing. After a cleaning process or the like is performed, a metal for electrode is embedded in the concave portions 69 to form a wiring structure.

According to the embodiment described above, the deposit 68 is deposited on the photoresist mask 61 so as to reduce the size of the openings 67, and thereafter, the SOG film 62 and the organic film 63, which are laminated below the photoresist mask 61, are etched. Therefore, the openings 67 formed in the organic film 63 can be made narrow, and the silicon oxide film 64 may be etched by using the organic film 63 having the narrow openings 67 as an etch mask so that narrow concave portions 69 can be obtained. In other words, due to the deposition of the deposit 68, the dimension L of the convex portions of the photoresist mask 61 can be increased. This prevents the toppling of the pattern.

Since $CH_4$ gas is used in the deposition process of depositing the deposit 68 on the photoresist mask 61, the deposit 68 does not contain fluorine. Thus, even when the components attached to the inner wall of the processing chamber 2 are decomposed during the etching of the organic film 63, the SOG film 62 is not etched. This prevents the reduction of the thickness of the SOG film 62 and the extension of the concave portions 69 formed in the SOG film 62, whereby etching can be favorably performed.

If a C—H—F series gas is used in the deposition process described above, it is necessary to clean the interior of the processing chamber 2 before the organic film 63 is etched, and thus it is required that the wafer W be once taken out of the processing chamber 2. However, with this embodiment, such cleaning is not required, and the wafer W can be continuously processed in the same processing chamber 2.

On the other hand, $CF_4$ gas used in the process of etching the SOG film 62 produces deposit containing fluorine. This deposit can be considered to be decomposed by plasma of an $O_2$ gas and CO gas which are used in the process of etching the organic film 63 so as to form F radicals which etch the SOG film 62. The $CF_4$ gas, however, has a lower ability to deposit the deposit than that of $CHF_3$ gas or $CH_2F_2$ gas. Thus, the organic film 63 can be etched while F radicals are hardly produced.

According to the present invention, the wafer W which is subjected to the plasma process is not limited to the wafer having the films of the foregoing three-layer structure, and may be a wafer having five or more layers including one or more films made of an organic matter and one or more films made of silicon oxide. In addition, an antireflective film of an organic film may be formed between the photoresist mask 61 and the SOG film 62, for example.

The etching method according to the present invention can be applied to the wafer W provided with the organic film 63 having the openings 67 with an aspect ratio of 2 or more; preferably 4 or more; more preferably not less than 6 and not more than 11.

In the present invention, the gas used for depositing the deposit 68 is not limited to $CH_4$ gas, and may be another hydrocarbon gas such as $C_2H_6$ gas. In addition, the diluent gas used together with the hydrocarbon gas is not limited to Ar, and may be a gas not containing a halogen such as $N_2$ gas or He gas. In addition, the diluent gas may contain $O_2$ gas or CO to such an extent that the photoresist mask 61 is not etched.

The plasma processing system 10 according to the present invention may be configured so that the first high frequency used for converting the process gas into plasma is supplied to the upper electrode 7 instead of the support table 3. That is, the plasma processing system 10 may have an upper/lower two-frequency configuration. Furthermore, although the magnetic fields are generated by the dipole ring magnets 25a and 25b in the foregoing embodiment, each process may be performed without generating the magnetic fields.

EXAMPLE

Next, a description will be made of experiments conducted to confirm advantageous effects of the present invention. The plasma processing system 10 shown in FIG. 1 was used in which the wafer W was subjected to the plasma process in each of the experiments. In the experiments, the wafer W having the structure shown in FIG. 3(a) was cut into a chip shape with 20 mm sides. The wafers for each experiment were attached to a central portion and an edge portion of a dummy wafer having a diameter of 300 mm (hereinafter, the chips are referred to a "central portion of the wafer W" and a "edge portion of the wafer W", respectively, and the dummy wafer with the chips attached thereto is referred to simply a "wafer W"). The thicknesses of the films (formed on each chip) were set to the following: the photoresist mask 61, 150 nm; the SOG film 62, 45 nm; the organic film 63, 300 nm; and the silicon oxide film 64, 500 nm. The dimension D of the opening 67 was set to 55 nm; and the dimension L of the convex portion of the photoresist mask 61 was set to 55 nm. In this case, each of the openings 67 was an oval hole. The dimension D of the opening 67 indicates the length of the minor axis of the oval.

Experiment 1

Deposition Process

The deposition process was performed on the abovementioned wafer W under process conditions as shown below. Among the process conditions, the first high frequency, the first high frequency power, the second high frequency, the second high frequency power, and the intensity of the magnetic field were common to Example 1 and Comparative Examples 1-1 to 1-4, and are shown below.

First high frequency: 100 MHz
First high frequency power: 1000 W
Second high frequency: 3.2 MHz
Second high frequency power: 0 W
Intensity of magnetic field: 300 G The process gas was changed in Example 1 and Comparative Examples 1-1 to 1-4, and the process pressure, the process gas flow rate(s), and the process time were changed depending on the type of the process gas(es) such that good process conditions for the respective process gases could be achieved, as shown below.

Example 1

Process pressure: 2.0 Pa (15 mTorr)
Process gas: $CH_4$/Ar=200/300 sccm
Process time: 30 seconds Comparative Example 1-1

Process pressure: 2.0 Pa (15 mTorr)
Process gas: $CHF_3$=500 sccm
Process time: 20 seconds Comparative Example 1-2

Process pressure: 2.0 Pa (15 mTorr)
Process gas: $CHF_3$=500 sccm
Process time: 30 seconds Comparative Example 1-3

Process pressure: 4.0 Pa (30 mTorr)
Process gas: $CHF_3$=500 sccm
Process time: 30 seconds Comparative Example 1-4

Process pressure: 2.0 Pa (15 mTorr)
Process gas: $CH_2F_2$/$O_2$=50/10 sccm
Process time: 30 seconds Experimental Results After each wafer W was subjected to the respective processes, a film thickness T between the surface of the wafer W and the boundary between the photoresist mask 61 and the SOG film 62 was measured in the central portion of the wafer W and the edge portion of the wafer W, as shown in FIG. 3(a). For evaluation of the results, the film thickness T was used instead of the thickness of the deposit 68. The reason was as follows. During the deposition process, the plasma of the process gas not only produces the deposits 68 on the photoresist mask 61 but also etches the photoresist mask 61. Thus, the total thickness of the photoresist mask 61 and the deposit 68 is important in order to obtain narrow concave portions 69 and prevent toppling of the pattern. The larger the thickness T is, the better the result of the deposition process is. The results are shown in Table 1.

TABLE 1

| | Film thickness T (nm) | |
|---|---|---|
| | Central portion of wafer W | Edge portion of wafer W |
| Example 1 | 170 | 160 |
| Comparative Example 1-1 | 91 | 96 |
| Comparative Example 1-2 | 97 | 103 |
| Comparative Example 1-3 | 95 | 98 |
| Comparative Example 1-4 | 133 | 135 |

As understood from Table 1, when the deposition process was performed under the process conditions in Example 1, the film thickness T was largest. In Comparative Example 1-4, the film thickness was the second largest following that in Example 1.

Experiment 2

SOG Film (62) Etching Process

Next, there was performed a process of etching the SOG film 62 to: as Example 2, a wafer W which had been subjected to a deposition process performed under process conditions which are the same as those of Example 1 which achieved the best result; and, as Comparative Example 2, a wafer W which had been subjected to a deposition process performed under process conditions which are the same as that of Comparative Example 1-4 which achieved the second best result. The process conditions were as follows.

Process Conditions in Example 2
    First high frequency: 100 MHz
    First high frequency power: 1200 W
    Second high frequency: 3.2 MHz
    Second high frequency power: 200 W
    Intensity of magnetic field: 300 G
    Process pressure: 1.3 Pa (10 mTorr)
    Process gas: $CF_4$=280 sccm
    Process time: 40 seconds Process Conditions in Comparative Example 2
    First high frequency: 100 MHz
    First high frequency power: 1000 W
    Second high frequency: 3.2 MHz
    Second high frequency power: 300 W
    Intensity of magnetic field: 300 G
    Process pressure: 2.0 Pa (15 mTorr)
    Process gas: $CHF_3/O_2$=500/5 sccm
    Process time: 45 seconds Note that the process conditions were determined depending on the type of the process gas(es) such that good process conditions for the respective process gases could be achieved.

Experimental Results

After each wafer W was subjected to the respective processes, the film thickness T was measured in the central portion of the wafer W and the edge portion of the wafer W in a manner similar to that in Experiment 1. Also in Experiment 2, it is considered that, the larger the thickness T is, the better the result of the SOG film 62 etching process is. This is because the photoresist mask 61 and the deposit 68 having a larger total thickness T has a higher ability to protect the SOG film 62 in the subsequent process of etching the organic film 63. The results are shown in Table 2.

TABLE 2

| | Film thickness T (nm) | |
|---|---|---|
| | Central portion of wafer W | Edge portion of wafer W |
| Example 2 | 66 | 42 |
| Comparative Example 2 | 83 | 65 |

For the results obtained in Example 2 and Comparative Example 2, the photoresist mask 61 (or the photoresist mask 61 and the deposit 68) remained even after the etching process of the SOG film 62. This means that the results were good. The film thickness T in Comparative Example 2 was larger than that in Example 1.

Experiment 3

Organic Film (63) Etching Process

Next, there was performed a process of etching the organic film 63 to: as Example 3, a wafer which had been subjected to a deposition process performed under process conditions which are the same as those of Example 1 and a process of etching the SOG film 62 performed under process conditions which are the same as those of Example 2; and, as Comparative Example 3, a wafer which had been subjected to a deposition process performed under process conditions which are the same as those of Comparative Example 1-4 and a process of etching the SOG film 62 performed under process conditions which are the same as those of Comparative Example 2. The process conditions were as follows.

Process Conditions in Example 3
    First high frequency: 100 MHz
    First high frequency power: 2400 W
    Second high frequency: 3.2 MHz
    Second high frequency power: 200 W
    Intensity of magnetic field: 300 G
    Process pressure: 0.7 Pa (5 mTorr)
    Process gas: $N_2/O_2/CO$=60/24/50 sccm
    Process time: 50 seconds Process Conditions in Comparative Example 3
    First high frequency: 100 MHz
    First high frequency power: 2400 W
    Second high frequency: 3.2 MHz
    Second high frequency power: 200 W
    Intensity of magnetic field: 300 G
    Process pressure: 1.1 Pa (8 mTorr)
    Process gas: $N_2/O_2/CO$=120/32/100 sccm
    Process time: 60 seconds Note that the process conditions were determined depending on the type of the process gas(es) such that good process conditions for the respective process gases could be achieved.

Experimental Results

After each wafer W was subjected to the above process, a cross section of the central portion of the wafer W and a cross section of the edge portion of the wafer W were observed so as to measure the thicknesses of the SOG films 62 and the dimensions at lower portions of the openings 67 formed in the organic film 63 using a scanning electron microscope (SEM). The results are shown in FIG. 4.

In Example 3, the SOG film 62 remained even after the process of etching of the organic film 63, and the organic film 63 was not toppled. This means that the results were good. The dimension at the lower portion of each of the openings 67 was smaller than the dimension D of each of the the openings 67 formed in the photoresist mask 61 before the deposition process was performed. Thus, the advantageous effect of the deposit 68 was confirmed. In addition, there is no difference between the central portion of the wafer W and the edge portion of the wafer W with respect to the film thickness of the SOG film 62 and to the dimension at the lower portion of each of the openings 67. From the results, it can be understood that a uniform deposition and etching were performed.

In Comparative Example 3, on the other hand, it was found that the SOG film 62 was etched and did not exist in some portions. Even at portions in which the SOG film 62 remained, the SOG film 62 was etched, and the corresponding openings 67 were tapered so as to narrow from their upper portions toward their lower portions. The dimension at the lower portions of the openings 67 was approximately 65 nm, and thus the effect of the deposit 68 was lower than in Example 3. In addition, some parts of the organic film 63 were toppled.

As previously described, the reasons for the above results are considered as follows. In the deposition process, when plasma of a C—H—F series gas is used for deposition, components containing carbon and fluorine are attached to the inner wall of the processing chamber 2. When the attached components are exposed to plasma of $O_2$ gas and/or CO gas, they are decomposed so as to produce F radicals which function as an etchant for the SOG film 62. As a result, the SOG film 62 is etched. In addition, it is considered that, if the SOG film 62 etched by the F radicals and the thickness thereof is reduced, the SOG film 62 can not provide a sufficient function as an etch mask for the plasma of an $O_2$ gas and CO gas used for etching the organic film 62.

Experiment 4

Experiment on reproducibility of Example 3

Next, the reproducibility of the experiment conducted in Example 3 was confirmed. In this experiment, a real wafer W having the structure of laminated films shown in FIG. 3(a) was used. The process conditions in the deposition process, the process of etching the SOG film 62, and the process of etching the organic film 63 is the same as those in Example 1, Example 2 and Example 3, respectively, except that: in the deposition process, a mixed gas of $CH_4$ gas and Ar gas were used as a process gas, $CH_4$ gas flow rate was 200 sccm, and Ar gas flow rate was 500 sccm; and, in the process of etching the organic film 53, the process time was 55 seconds.

Experimental Results

Figure 5:
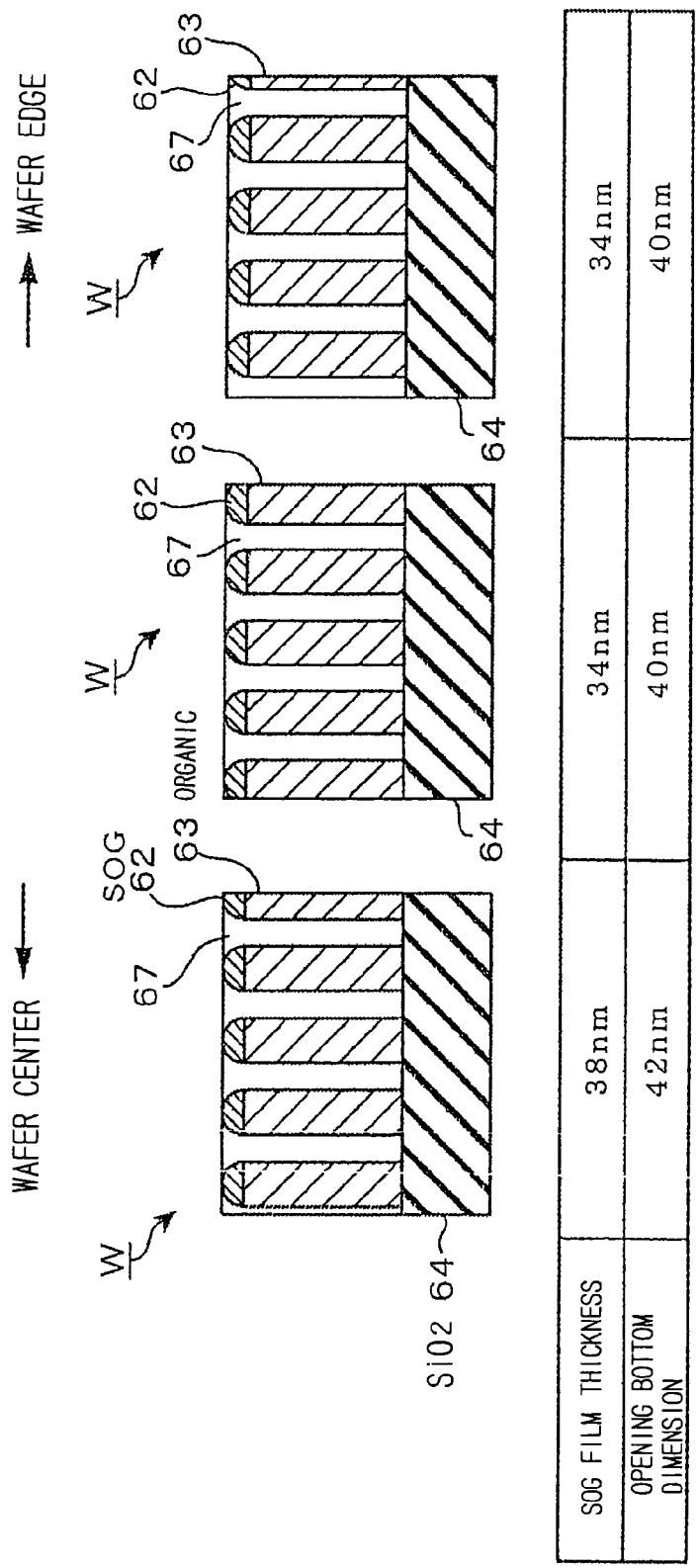
FIG. 5 shows illustrations showing results of Experiment 4.
Figure 6:
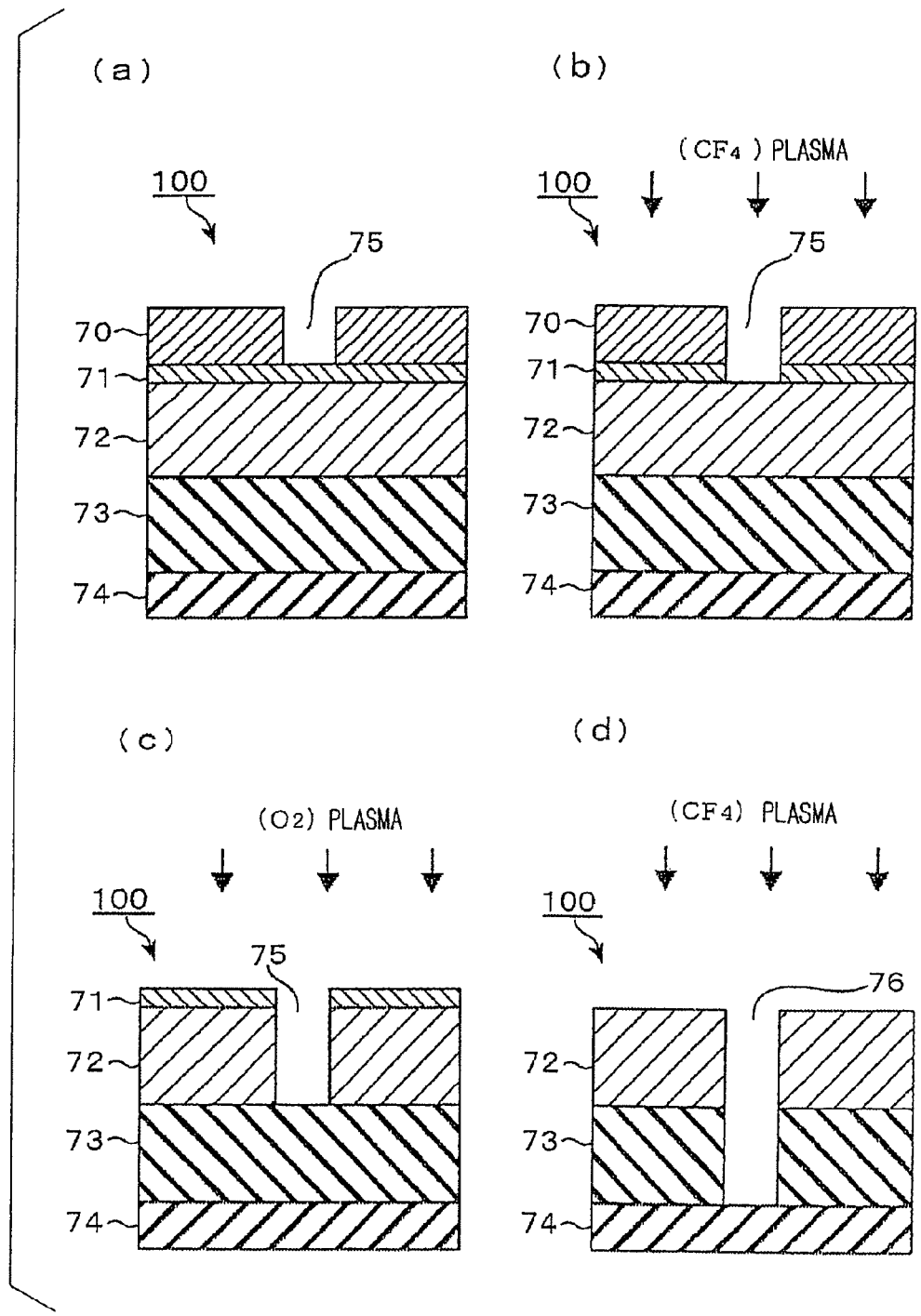
FIG. 6 shows illustrations for explaining the change in the structure of a wafer in a conventional plasma etching process.
Figure 7:
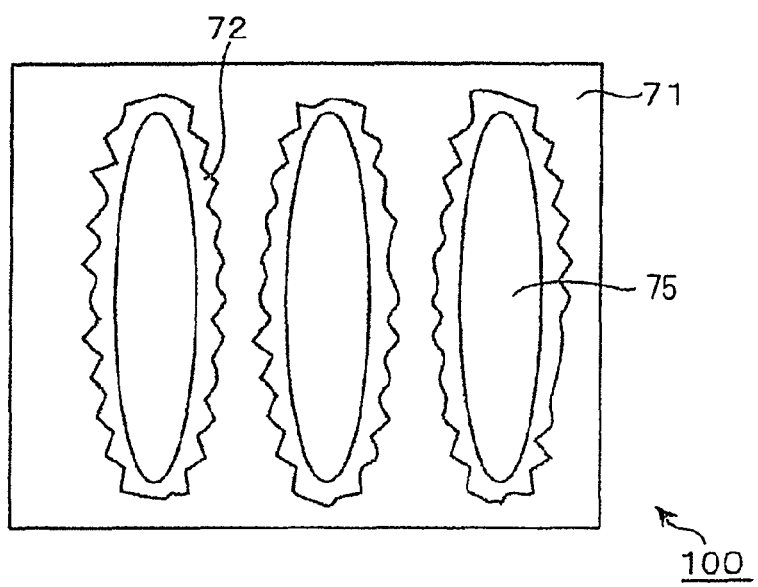
FIG. 7 shows a schematic plan view and a schematic cross-sectional view of the structure of a wafer W after etching an SOG film in a conventional plasma etching process.
Figure 7:
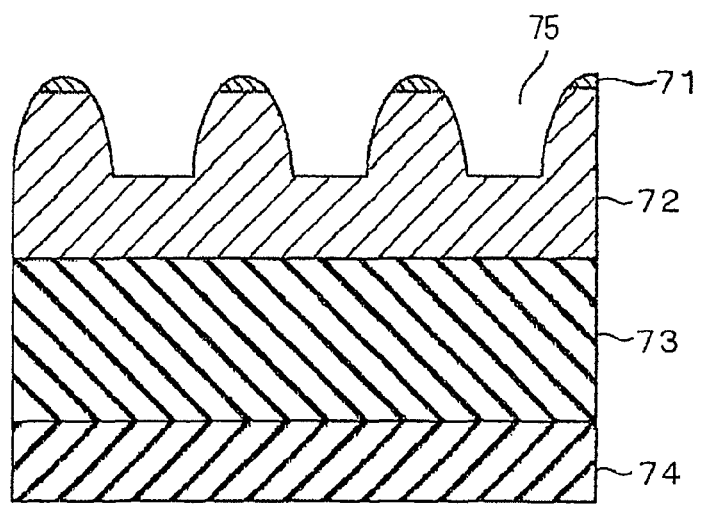

After the above processes were performed, cross sections of a center portion, an edge portion, and an intermediate portion between the center portion and the edge portion were observed so as to measure the thicknesses of the SOG films 62 and the dimensions at lower portions of the openings 67 formed in the organic film 63, using a scanning electron microscope (SEM) in a similar manner to in Experiment 3. The results are shown in FIG. 5

The reproducibility of Experiment 3 was confirmed, and the results were thus good.

The invention claimed is:
1. An etching method comprising:
providing a substrate having thereon a $SiO_2$ film, an organic film, a coating film, and a photoresist film stacked in that order, the photoresist film having openings through which the coating film is exposed;
forming plasma of a first gas comprising Ar gas and $CH_4$ gas, thereby depositing a single-layer deposition film, comprising carbon and hydrogen, on the photoresist film in such a way that thickness of the photoresist film increases, that size of the openings is reduced, and that the single-layer deposition film is not deposited on the coating film, wherein the depositing of the single-layer deposition film on the photoresist film is conducted only once; and
forming plasma of a second gas containing carbon and fluorine, thereby etching the coating film by using the photoresist film and the single-layer deposition film as an etch mask, wherein
the etching of the coating film is performed directly after the depositing of the single-layer deposition film,
the coating film is a spin-on-glass film, and
the first gas fails to include fluorine, and the single-layer deposition film fails to include fluorine.
2. The method according to claim 1, wherein the second gas containing carbon and fluorine comprises a mixed gas $CF_4$ gas and Ar gas.
3. The method according to claim 1, further comprising:
etching the organic film after etching the coating film.
4. The method according to claim 1, further comprising:
etching the $SiO_2$ film after etching the organic film.
5. An etching method comprising:
providing a substrate having thereon a $SiO_2$ film, an organic film, a coating film, and a photoresist film stacked in that order, the photoresist film having openings through which the coating film is exposed;
forming plasma of a first gas comprising Ar gas and $CH_4$ gas, thereby depositing a single-layer deposition film, comprising carbon and hydrogen, on the photoresist film in such a way that thickness of the photoresist film increases, that size of the openings is reduced, and that the single-layer deposition film is not deposited on the coating film, wherein the depositing of the single-layer deposition film on the photoresist film is conducted only once; and
forming plasma of a second gas containing carbon and fluorine, thereby etching the coating film by using the photoresist film and the single-layer deposition film as an etch mask, wherein
said method performs only a single depositing step for the deposition of the single layer deposition film in the overall process,
the coating film is a spin-on-glass film and
the first gas fails to include fluorine and the single-layer deposition film fails to include fluorine.
6. The method according to claim 5, wherein the second gas containing carbon and fluorine comprises a mixed gas of $CF_4$ gas and Ar gas.
7. The method according to claim 5, further comprising:
etching the organic film after etching the coating film.
8. The method according to claim 5, further comprising:
etching the $SiO_2$ film after etching the organic film.
9. An etching method comprising:
providing a substrate having thereon a $SiO_2$ film, an organic film, a coating film, and a photoresist film stacked in that order, the photoresist film having openings through which the coating film is exposed;
forming plasma of a first gas comprising Ar gas and $CH_4$ gas without containing fluorine, thereby depositing a single-layer deposition film, comprising carbon and hydrogen without containing fluorine, on the photoresist film in such a way that thickness of the photoresist film increases, that size of the openings is reduced, and that the single-layer deposition film is not deposited on the coating film, wherein the depositing of the single-layer deposition film on the photoresist film is conducted only once; and
forming plasma of a second gas containing carbon and fluorine, thereby etching the coating film by using the photoresist film and the single-layer deposition film as an etch mask,
wherein the coating film is a spin-on-glass film.

10. The method according to claim 9, wherein the second gas containing carbon and fluorine comprises a mixed gas of $CF_4$ gas and Ar gas.

11. The method according to claim 9, further comprising: etching the organic film after etching the coating film.

12. The method according to claim 9, further comprising: etching the $SiO_2$ film after etching the organic film.

* * * * *